(12) United States Patent
Ozeki

(10) Patent No.: US 6,236,615 B1
(45) Date of Patent: May 22, 2001

(54) SEMICONDUCTOR MEMORY DEVICE HAVING MEMORY CELL BLOCKS DIFFERENT IN DATA STORAGE CAPACITY WITHOUT INFLUENCE ON PERIPHERAL CIRCUITS

(75) Inventor: Seiji Ozeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/334,807

(22) Filed: Jun. 17, 1999

(30) Foreign Application Priority Data

Jun. 19, 1998 (JP) .................................................. 10-173261

(51) Int. Cl.⁷ ...................................................... G11C 8/00
(52) U.S. Cl. ...................... 365/230.03; 365/200; 365/51; 365/52
(58) Field of Search ............................. 365/230.03, 200, 365/51, 52, 63

(56) References Cited

U.S. PATENT DOCUMENTS 5,220,518 * 6/1993 Haq ............................. 365/230.03 X
5,666,315 * 9/1997 Tsukude et al. ...................... 365/200

* cited by examiner

*Primary Examiner*—Huan Hoang

(57) ABSTRACT

A semiconductor dynamic random access memory device has a memory cell array divided into columns of memory cell blocks equal to a natural number except powers of two such as, for example, six and arranged in rows and columns, redundant memory cells are formed in two columns of memory cell blocks so as to equalize the loads driven by decoder units of a column address decoder, and the memory cell blocks are respectively formed in areas equal in width to one another so as to equalize sub-word lines connected between row address sub-decoders and the regular/redundant memory cells regardless of the number of regular/redundant memory cells incorporated in each memory cell block.

15 Claims, 9 Drawing Sheets

SEMICONDUCTOR MEMORY DEVICE HAVING MEMORY CELL BLOCKS DIFFERENT IN DATA STORAGE CAPACITY WITHOUT INFLUENCE ON PERIPHERAL CIRCUITS

FIELD OF THE INVENTION

This invention relates to a semiconductor memory device such as a dynamic random access memory device and, more particularly, to the layout of memory cell blocks incorporated in the semiconductor memory device.

DESCRIPTION OF THE RELATED ART

A typical example of the semiconductor dynamic random access memory device is shown in FIG. 1 of the drawings. The prior art semiconductor dynamic random access memory device comprises memory cell sub-arrays 1a/1b/1c/1d, row address decoders 2a/2b and column address decoder/selector units 3a/3b and sense amplifiers 4a/4b. These components 1a–1d/2a–2b/3a–3b/4a–4b are arranged on a semiconductor chip 5 as follows. Each of the memory cell sub-arrays 1a–1d includes memory cells, word lines selectively connected to the memory cells and bit line pairs selectively connected to the memory cells. The memory cell is of the type having an access transistor and a storage capacitor connected in series. The word lines extend in the direction indicated by an arrow AR1, and the bit line pairs extend in a perpendicular direction to the word lines. The memory cell sub-arrays 1a/1b/1c/1d are respectively assigned to areas of the semiconductor chip 5, and the boundaries of each area extending in parallel to the word lines are hereinbelow referred to as "side lines" of the memory cell sub-array 1a/1b/1c/1d. On the other hand, the other boundaries in parallel to the bit line pairs are referred to as "end lines" of the memory cell sub-arrays 1a/1/b/1c/1d. The memory cell sub-array 1b is contiguous to the memory cell sub-array 1c, and a side line is shared between the memory cell sub-arrays 1b and 1c. The other side lines of the memory cell sub-arrays 1b/1c are spaced from the side lines of the memory cell sub-arrays 1a/1d, and the areas between the memory cell sub-arrays 1b/1c and the other memory cell sub-arrays 1a/1d are assigned to the column address decoders/selectors/sense amplifiers 3a/4a and 3b/4b, respectively. The row address decoders 2a/2b are assigned areas contiguous to the end lines of the memory cell sub-arrays 1a/1b and the end lines of the memory cell sub-arrays 1c/1d, respectively. The data storage capacity of the semiconductor dynamic random access memory device has been increased, and a shared-sense amplifier technology and a main-sub word line technology are employed in the semiconductor dynamic random access memory device. The shared sense amplifiers are provided on both ends of the memory cell sub-arrays, and selected one of the shared sense amplifiers increases the magnitude of a potential difference representative of a data bit read out from one of the memory cells forming a memory cell sub-array. The main-sub word line technology stepwise selects a row of memory cells from the memory cell sub-array. A row address predecoded signal is supplied to a main row address decoder, and the main address decoder selects one of the main word lines. Sub-decoders are selectively enabled through the main word lines, and the selected sub-decoder changes one of the sub-word lines to the active level in response to another row address predecoded signal. The rows of memory cells are respectively connected to sub-word lines, and data bits are read out from the row of memory cells connected to the selected sub-word line. Assuming now that the row address signal consists of (n+1) address bits X0, X1, X2, X3, ... and Xn, the main row address decoder is responsive to the address bits X3–Xn so as to select one of the main word lines and the sub-decoder coupled to the selected main word line, and the selected sub-decoder is responsive to the address bits X0–X2 so as to select a row of memory cells through the associated sub-word line. Thus, the main-sub word line technology stepwise selects the row of memory cells from the memory cell array, and the groups of sub-word lines divide the memory cell array into memory cell sub-arrays assigned areas parallel to one another.

FIG. 2 illustrates the layout of another semiconductor dynamic random access memory device. The shared sense amplifier technology and the main-sub word line technology are employed in the prior art semiconductor dynamic random access memory device. A memory cell array 10 is assigned a rectangular area on a semiconductor chip except a lattice-like area, and the memory cells MC are formed in small rectangular sub-areas as shown. The space over the small rectangular sub-area to be occupied by the memory cells MC is called as "plate space".

A main row address decoder/a controller for sense amplifiers 11 are assigned an area contiguous to one of the end lines, and main word lines extends from the row address decoder 1 lover rows of plate spaces in the direction indicated by an arrow AR2. Sub-decoders SD are assigned narrow areas between the small rectangular areas of each row, and sub-word lines extend from each sub-decoder SD over the place spaces on both sides thereof as indicated by an arrows AR3.

A column address decoder 12 assigned an area contiguous to a side line of the memory cell array 10, and bit line pairs (not shown) extend over the place spaces in a direction perpendicular to the word lines. Sense amplifiers SA are assigned narrow areas between the small rectangular areas in each column. As a result, two groups of sense amplifiers SA are provided in the narrow areas along both side lines of the small rectangular area, and two sub-decoders SD are provided in the narrow areas along both end lines of the small rectangular area. However, extremely small rectangular areas at the four corners of the small rectangular area are not occupied by the sense amplifiers nor the sub-decoder. The extremely small rectangular areas are marked with "x" in FIG. 2.

Drivers for the sense amplifiers SA are assigned the extremely small rectangular areas. Thus, the sub-drivers SD, the sense amplifiers SA and the drivers for the sense amplifiers SA are distributed to the narrow areas around the small rectangular areas. This layout is appropriate to increase the memory cells MC, and is conducive to enhance the production yield, because the layout allows the manufacturer to widen the gap between the signal lines. The layout is hereinbelow referred to as "layout for a distributed function".

The manufacturer who employs the layout for a distributed function is to decide how many columns of sub-decoders SD the memory cell array 10 requires. In other words, the manufacturer decides how many memory cell blocks MC the memory cell array 10 should be divided. The memory cell array 10 is assumed to be $2^l \times 2^m$ bit dynamic random access memory cell array as shown in FIG. 3. The row of $2^m$ bit memory cells is divided into $2^{m-n}$ memory cell blocks MC, and $2^n$ memory cells form a row of memory cells in the memory cell block MC. The layout of memory cell blocks MC makes the plate spaces equal to one another.

The manufacturer optimizes "n" from two viewpoints, i.e., the rectangular area occupied by the memory cell array 10 and an access to data stored in the memory cells. If "n" is increased, the sub-decoders SD are also increased, and a wide rectangular area is required for the memory cell array 10. However, the access speed is got better. Because, the load to each sub-decoder SD is decreased, and the driver circuits for the sense amplifiers are increased. On the other hand, if "n" is decreased, the sub-decoders SD and the driving circuits for the sense amplifiers SA are decreased. The rectangular area required for the memory cell array 10 becomes narrow. However, the load is increased, and the access speed is got worse.

Using the layout for a distributed function shown in FIG. 3, a manufacturer may arrange dynamic random access memory cell blocks MC in a layout shown in FIG. 4. Two rectangular areas on a semiconductor chip 20 are respectively assigned to two memory cell arrays 21/22, and the sub-decoders, the sense amplifiers and the drivers for the sense amplifiers are formed on the lattice-like areas in the rectangular areas. The memory cells, the sense amplifiers, the sub-decoders and the drivers are similarly arranged in each of the rectangular areas, and the layout in each rectangular area is equivalent to the layout shown in FIG. 3. Thus, the data storage capacity of the semiconductor dynamic random access memory device shown in FIG. 4 is twice as large as the data storage capacity of the semiconductor dynamic random access memory device shown in FIG. 3. Though not shown in the figure, each of the memory cell blocks MC has a predetermined number of redundant dynamic random access memory cells, and defective columns of regular dynamic random access memory cells are replaceable with the columns of redundant dynamic random access memory cells.

In order to selectively access the dynamic random access memory cells, a main row address decoder/sense amplifier controller 23 is provided between the memory cell arrays 21 and 22, and column address decoders 24/25 are respectively located along side lines of the memory cell arrays 21/22. Main word lines (not shown) extend from both sides of the main row address decoder/sense amplifier controller 23.

An external device can access data stored in the semiconductor dynamic random access memory device as fast as the access to the data stored in the memory cell array 10. However, the semiconductor chip 20 is twice as long as the semiconductor chip used for the memory cell array 10. If the semiconductor chip 20 is too long to be accommodated in a standard package, the manufacturer increases "n" to "n+1", "n+2", . . . or "n+x", and, accordingly, decreases the sub-decoders SD. In this way, the manufacturer shortens the semiconductor chip 20, and accommodates it in the standard package.

If the semiconductor dynamic random access memory device still satisfies customer's design specifications, the above-described design method is employable. However, the semiconductor dynamic random access memory device redesigned through the above-described method does not fall into the customer's design specifications. Assuming now that each of the $2^l \times 2^m$ bit memory cell arrays 21/22 is redesigned from 8 memory cell blocks MC to 4 memory cell blocks MC in each row, four columns of sub-decoders are deleted from the rectangular area assigned to each memory cell array 21/22, and, accordingly, eight columns of sub-decoders are deleted from the semiconductor chip 20. If each narrow area assigned to the sub-decoder is 30 microns wide, the semiconductor chip 20 is decreased by 240 microns. However, the sub-word lines are twice as long as those of the semiconductor dynamic random access memory device shown in FIG. 3. As a result, the parasitic capacitance coupled to each sub-word line is twice as much as that of the sub-word line incorporated in the semiconductor dynamic random access memory device shown in FIG. 3, and the resistance of each sub-word line is also twice as much as that of the sub-word line incorporated in the semiconductor dynamic random access memory device shown in FIG. 3. The time constant against the driving signal on the sub-word line is four times increased.

Each driving circuit at a corner of the memory cell block is expected to drive the sense amplifiers SA twice as many as the sense amplifiers SA of the semiconductor dynamic random access memory device shown in FIG. 3, and the current driving capability of the driving circuit is decreased to a half of that of the driving circuit incorporated in the semiconductor dynamic random access memory device shown in FIG. 3. As a result, the data sensing is decelerated, and the sense amplifiers SA destroy the read-out data in the worst case.

The memory cell array 10/21/22 is divided by $2^a$ where a is an integer. When a is incremented or decremented by one, the load coupled to the signal line such as the sub-word line is decreased to ½ or twice incremented. Thus, the load is widely changed, and the optimization is difficult. If the manufacturer decreases the $2^a$ memory cell blocks MC to memory cell blocks MC between $2^a$ and $2^{a-1}$ in each row, some memory cell blocks MC are different in characteristics from the others, and the manufacturer suffers from the different circuit characteristics between the memory cell blocks MC. For example, if a memory cell array is changed from $2^3$ memory cell blocks to 6 memory cell blocks, a column of sub-decoders is deleted from between two memory cell blocks, and another column of sub-decoders remains between the other two memory cell blocks. As a result, the row has one large memory cell block and two small memory cell blocks, and the load coupled to the sub-word lines and the current driving capability of the driving circuit are different between the large memory cell block and the small memory cell blocks. Thus, the memory cell blocks MC are only changed between $2^a$ and $2^{a-1}/2^{a+1}$, and the circuit characteristics are widely changed.

SUMMARY OF THE INVENTION

It is therefore an important object of the present invention to provide a semiconductor memory device, which allows a manufacturer to easily optimize the layout of memory cell blocks without difference in circuit characteristics between peripheral circuits.

In accordance with one aspect of the present invention, there is provided a semiconductor memory device fabricated on a semiconductor substrate comprising a memory cell array including plural memory cell blocks equal to a multiple of a natural number except powers of two, formed on first areas arranged in a first direction at intervals and a second direction perpendicular to the first direction at intervals and selectively categorized in a first kind of memory cell block having directly addressable regular memory cells and a second kind of memory cell block having other regular memory cells and redundant memory cells, plural groups of first selecting signal lines associated with the plural memory cell blocks, respectively, and respectively extending over the first areas assigned to the associated memory cell blocks in the first direction, a first peripheral circuit formed in second areas between the first areas spaced in the first direction, connected to the plural groups of first selecting signal lines and responsive to first address signals so as to selectively drive the first selecting signal lines, thereby making the directly addressable memory cells, the other directly addressable memory cells or the redundant memory cells selectively accessible, second selecting signal lines respectively coupled to loads approximately equal to one another, a second peripheral circuit connected to the second selecting signal lines for selectively connecting the directly addressable memory cells, the other directly addressable memory cells or the redundant memory cells selected by the first peripheral circuit to a signal line and a third peripheral circuit including plural sub-circuits respectively connected to the second selecting signal lines and responsive to second address signals for selectively driving the second selecting signal lines, a part of the directly addressable memory cells and a part of the other directly addressable memory cells are replaceable with the redundant memory cells, the first areas have respective first lengths measured in the first direction and approximately equal to one another, the first selecting lines of the plural groups are selectively connected to the directly addressable memory cells, the other directly addressable memory cells and the redundant memory cells incorporated in the associated memory cell blocks.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 1:
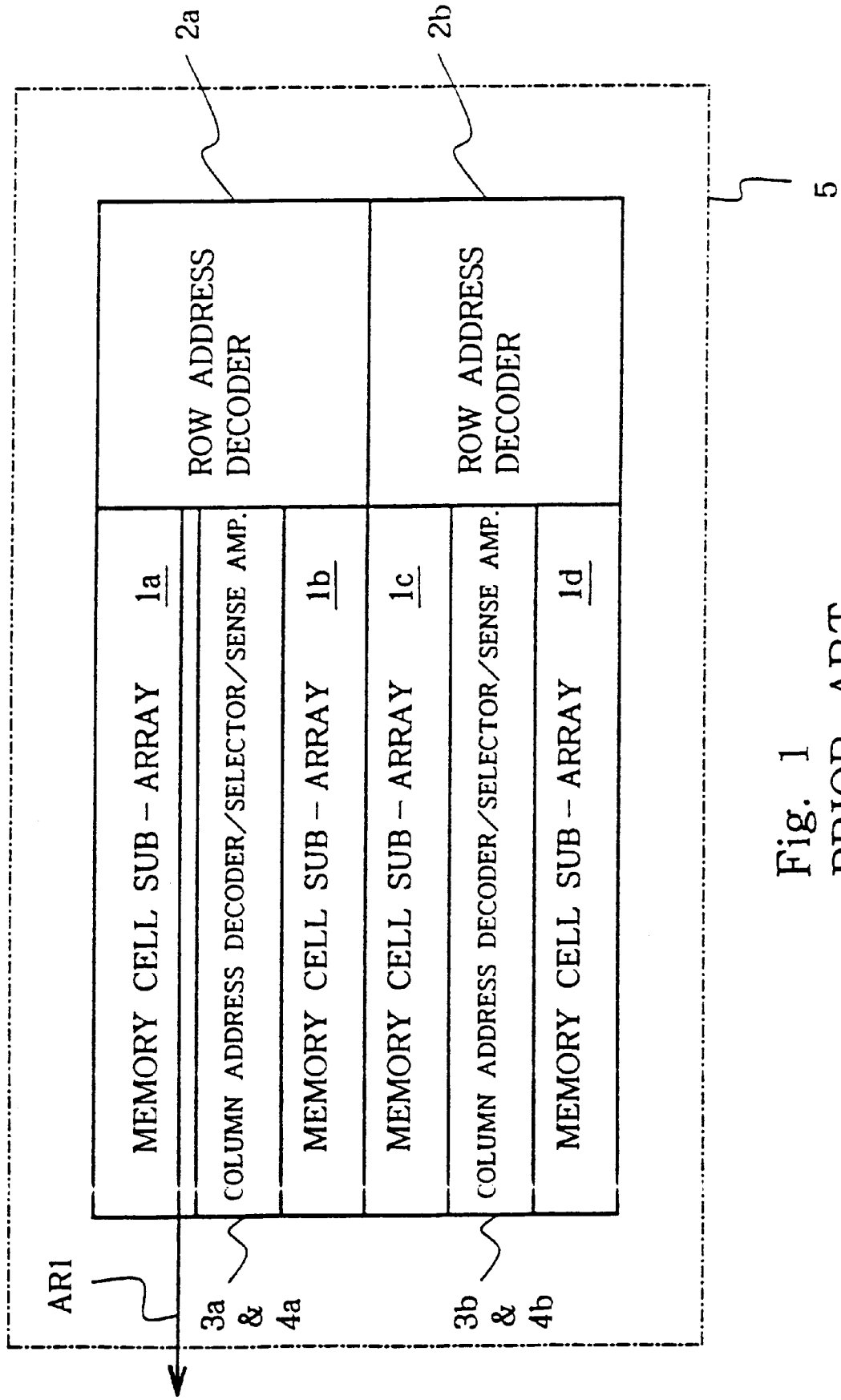
FIG. 1 is a schematic plane view showing the layout of the components incorporated in the prior art semiconductor dynamic random access memory device.
Figure 2:
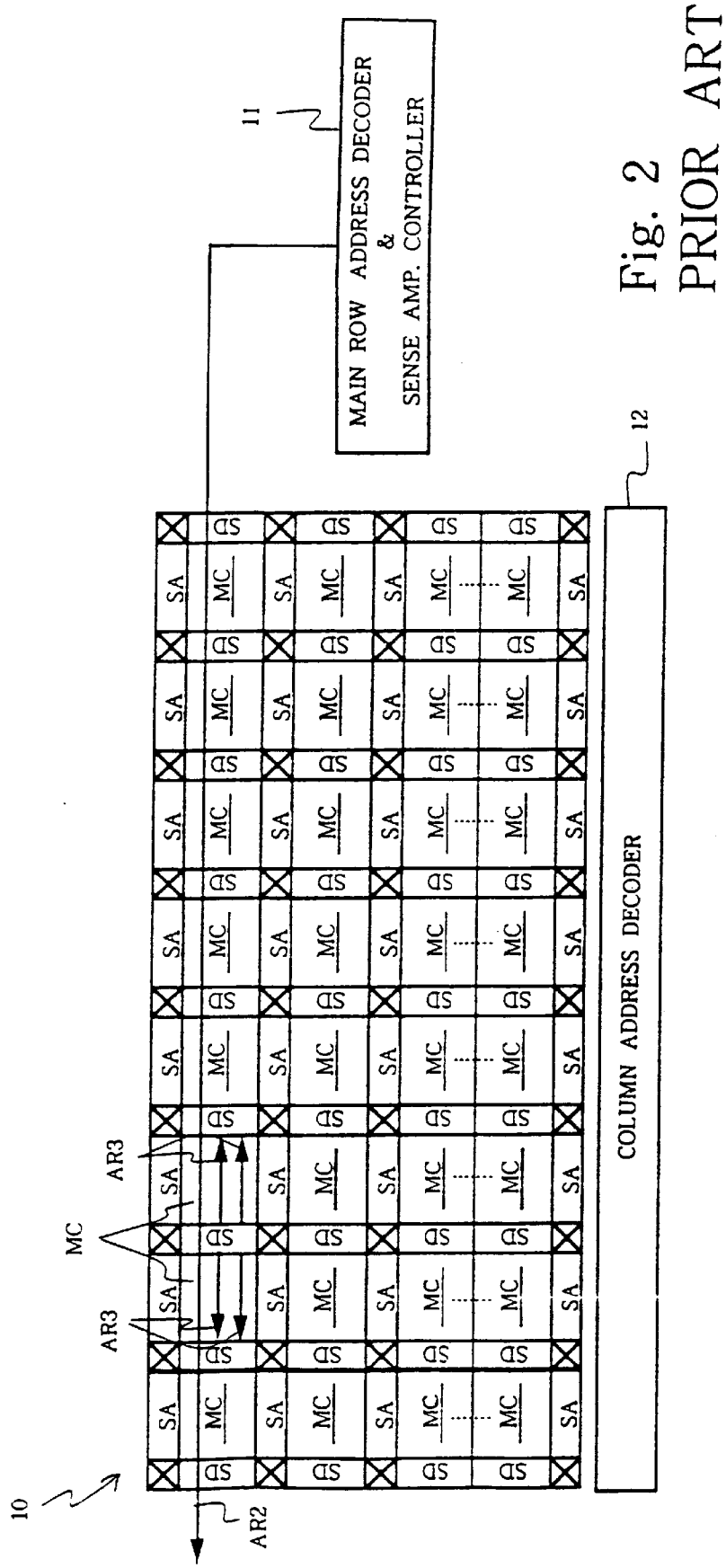
FIG. 2 is a schematic plane view showing the layout of the components incorporated in the prior art semiconductor dynamic random access memory device designed in the shared sense amplifier technology and the main-sub word line technology.
Figure 3:
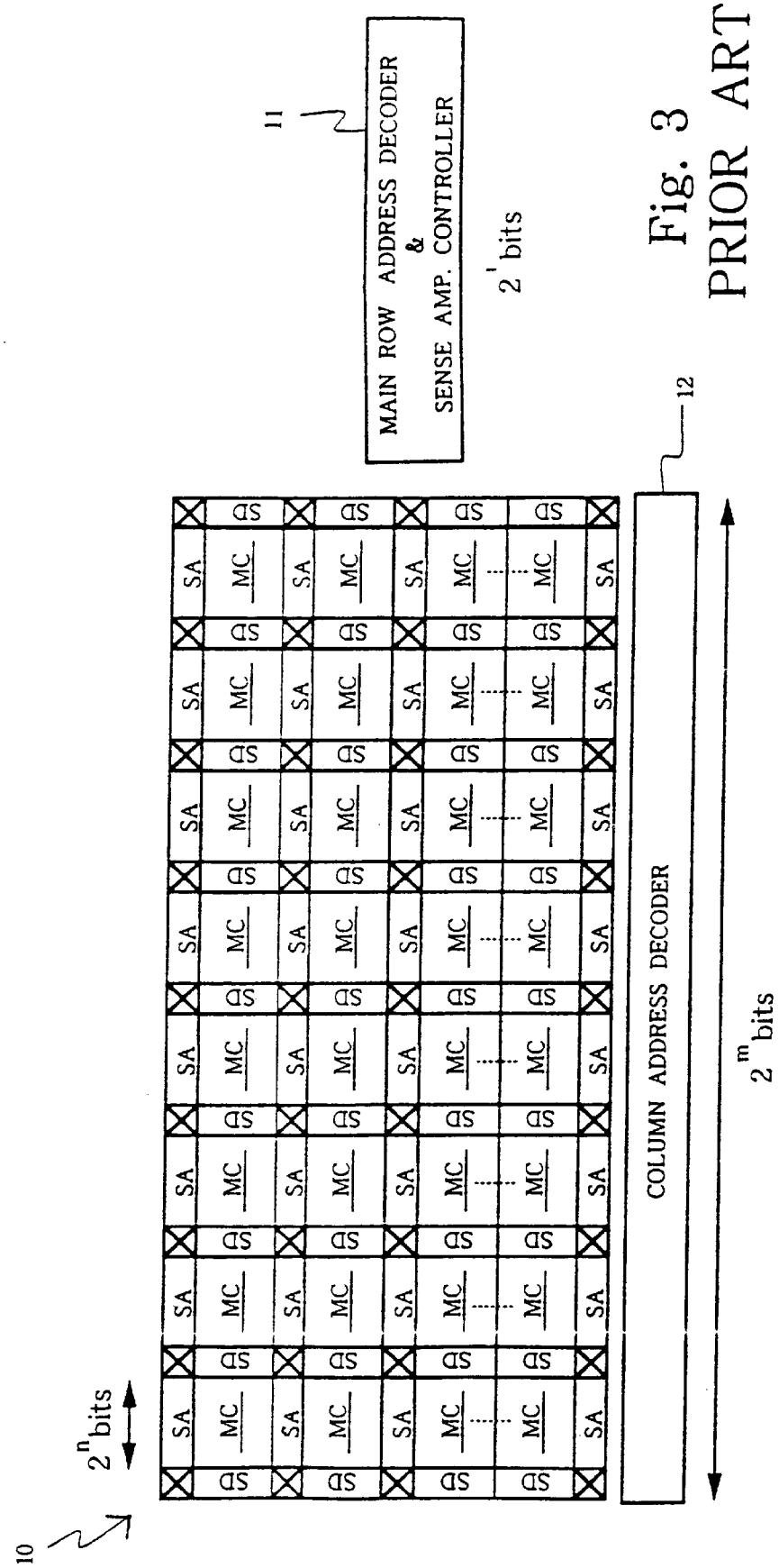
FIG. 3 is a schematic plane view showing the layout of the memory cell blocks and the other components incorporated in the prior art semiconductor dynamic random access memory device
Figure 4:
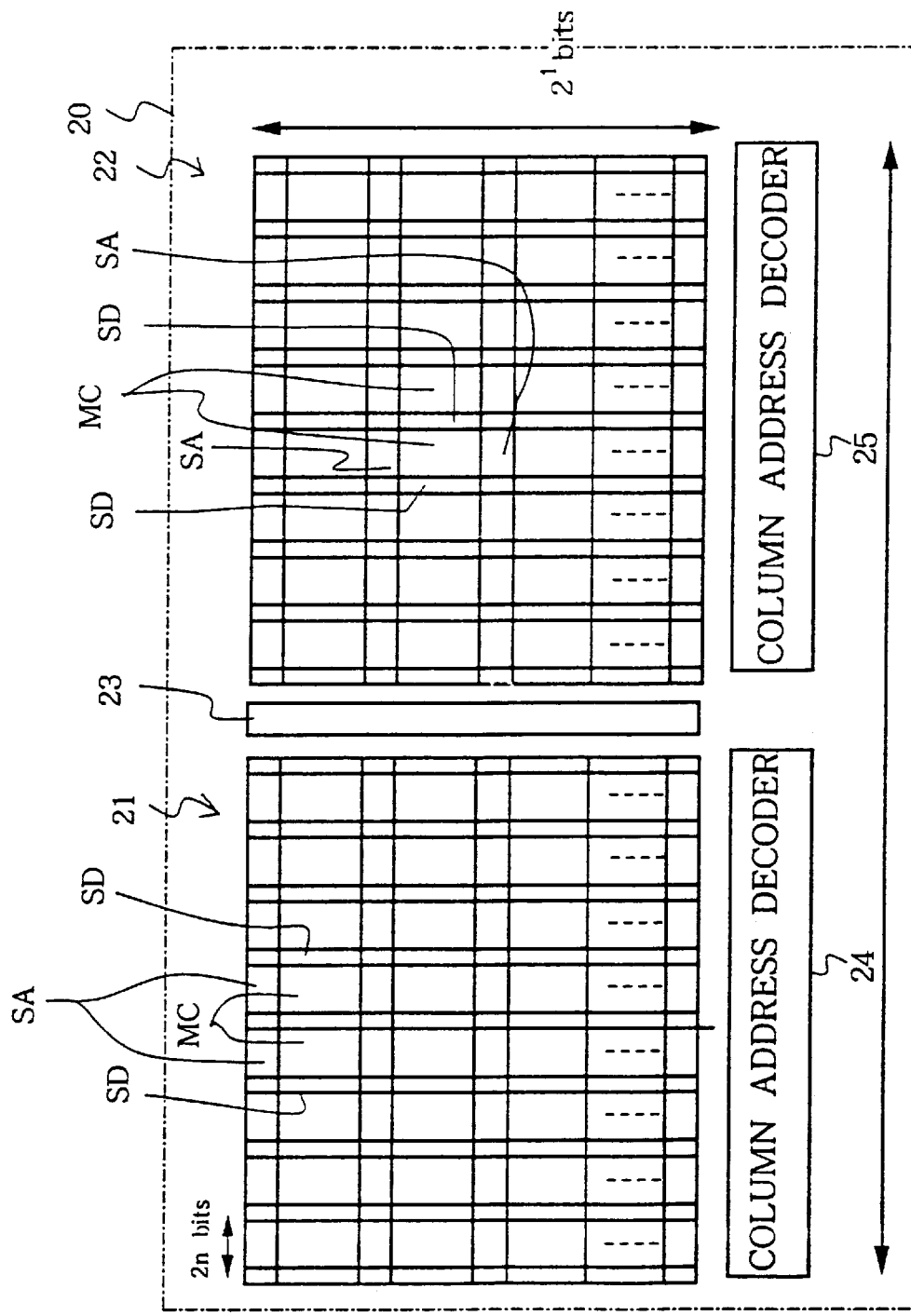
FIG. 4 is a schematic plane view showing the layout of the prior art semiconductor dynamic random access memory device with the memory cell array twice as much in the data storage capability as that shown in FIG. 3.
Figure 5:
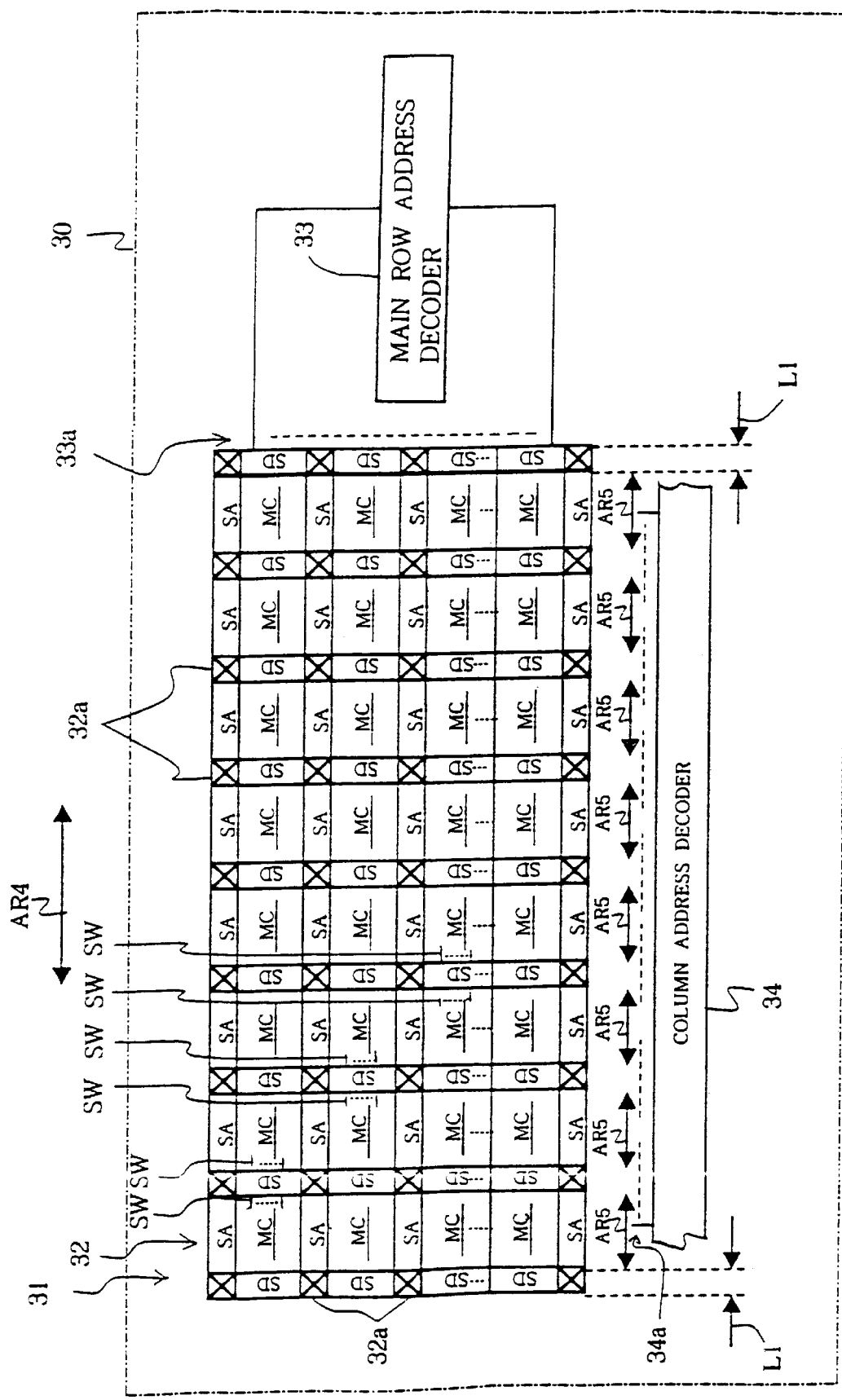
FIG. 5 is a schematic plane view showing the layout of memory cells incorporated in a semiconductor dynamic random access memory device according to the present invention.

Referring first to FIG. 5 of the drawings, a semiconductor dynamic random access memory device embodying the present invention is fabricated on a semiconductor chip 30. In the following description, term "row" is indicative of a direction labeled with arrow "AR4", and term "column" is indicative of a direction perpendicular to the direction of row.

The semiconductor dynamic random access memory device comprises a memory cell array 31, and the memory cell array 31 occupies a rectangular area 32 except a lattice-like sub-area 32a. Plural plate spaces are respectively defined on rectangular sub-areas arranged in rows and columns in the rectangular area 32, and are respectively assigned to memory cell blocks MC. As a result, the memory cell blocks MC are also arranged in rows and columns. Plural dynamic random access memory cells are incorporated in each memory cell block MC, and a series combination of an access transistor and a storage capacitor serves as the dynamic random access memory cell.

Figure 7:
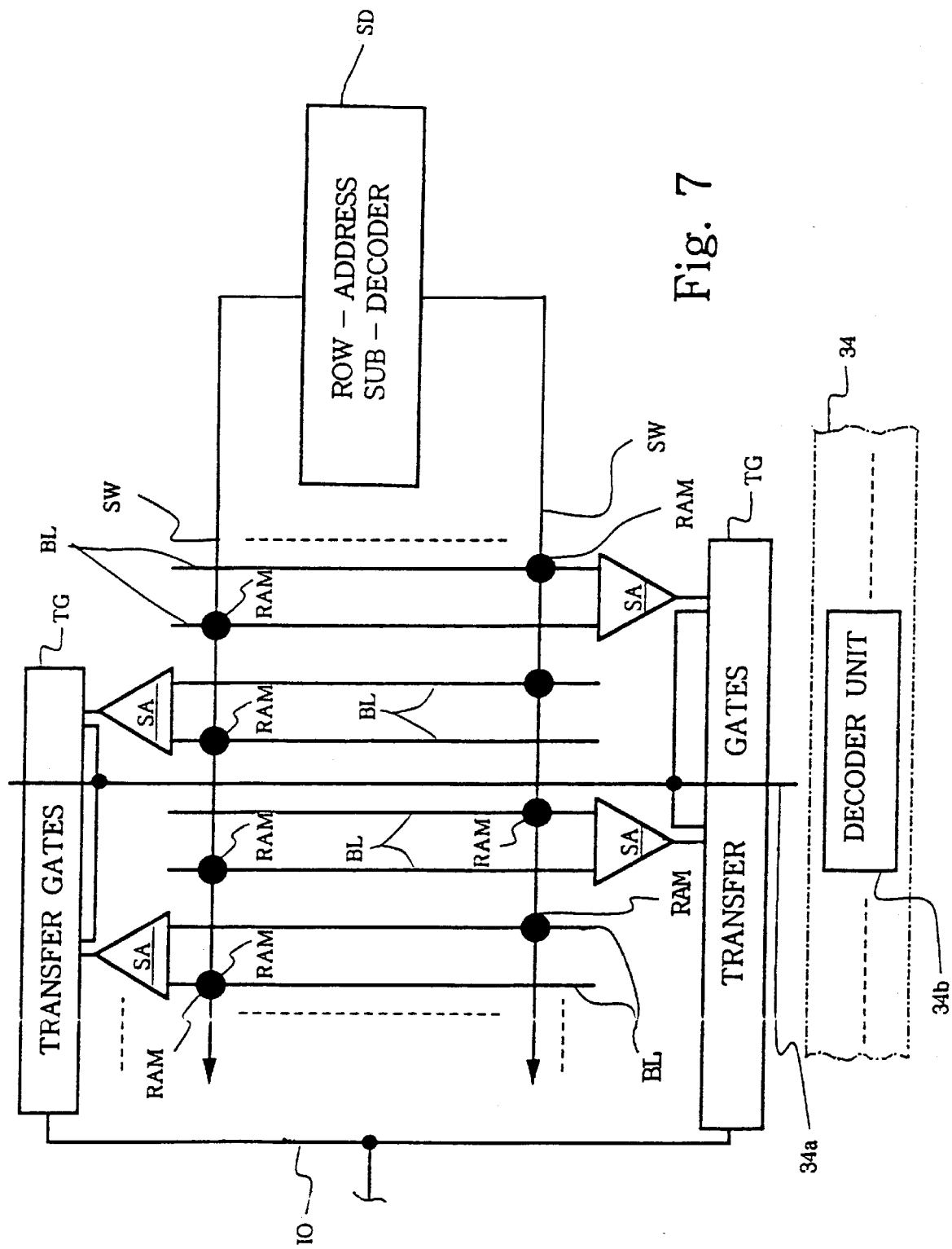
FIG. 7 is a circuit diagram showing the layout of dynamic random access memory cells, sense amplifiers, a row address sub-decoder and a column address decoder incorporated in the semiconductor dynamic random access memory device shown in FIG. 6.

The semiconductor dynamic random access memory device further comprises a main row address decoder 33, main word lines 33a, a column address decoder 34 and control signal lines 34a connected between the column address decoder 34 and transfer gates TG (see FIG. 7). The main row address decoder 33 and the column address decoder/selector 34 are located outside the rectangular area 32. The main row address decoder 33 occupies a peripheral area extending in the direction of column, and is opposite to the right end line of the rectangular area 32. The main word lines 33a extend from the main row address decoder 33 over the rows of memory cell blocks MC in the direction of row. On the other hand, the column address decoder/selector 34 occupies a peripheral area extending in the direction of row, and is opposite to a side line of the rectangular area 32. The bit line pairs 34a are selectively connected between the dynamic random access memory cells in the columns of memory cell blocks MC and the column address decoder/selector 34.

The semiconductor dynamic random access memory device further comprises sense amplifiers SA, bit line pairs BL (see FIG. 7) selectively connected between the dynamic random access memory cells RAM and the sense amplifiers SA, row address sub-decoders SD, drivers X for the sense amplifiers SA, a redundant circuit and a data bus IO connectable through the transfer gates TG to the sense amplifiers SA. The transfer gates TG may be formed in the first sub-areas. Although other components such as, for example, a sense amplifier controller, a data buffer, a read/write circuit and a precharge circuit are further incorporated in the semiconductor dynamic random access memory device, they are not shown in FIG. 5 for the sake of simplicity.

The lattice-like sub-area 32a is broken down into first sub-areas assigned to the sense amplifiers SA, second sub-areas assigned to the row address sub-decoders SD and third sub-areas assigned to the drivers X. The first sub-areas are arranged in rows, and the rows of memory cell blocks MC intervene between the rows of first sub-areas and, accordingly, between the rows of sense amplifiers SA. The second sub-areas are arranged in columns, and the columns of memory cell blocks MC intervene between the columns of second sub-areas and, accordingly, between the columns of memory cell blocks MC. The third sub-areas are located at the corners of the rectangular sub-areas, and the drivers D are located at the corners of the memory cell blocks MC. The dynamic random access memory cells of each memory cell block MC are arranged in matrix, and sub-word lines SW extend from both sides of each row address sub-decoder SD in the direction of row. Although the sub-word lines SW project from some row address sub-decoders SD, the sub-word lines SW are connected between the dynamic random access memory cells and all the row address sub-decoders SD.

The main word lines 33a are selectively connected to the row address sub-decoders SD. Row address predecoded signals are supplied to the main row address decoder 33, and the main row address decoder 33 selectively makes the row address sub-decoders SD responsive to other row address predecoded signals. The selected row address sub-decoder SD selectively drives the sub-word lines SW, and data bits are read out from the dynamic random access memory cells connected to the selected sub-word line SW to the associated bit line pairs BL. The read-out data bits generate potential differences on the bit line pairs BL, and the sense amplifiers SA increase the magnitude of the potential differences. Column address predecoded signals are supplied to the column address decoder 34, and the column address decoder 34 selectively changes the control signal lines 34a to an active high level. The control signal lines 34a are selectively connected to the transfer gates TG, and the selected control signal line 34a makes the transfer gates TG to selectively connect the sense amplifiers SA to the data bus IO. The data bus IO propagates data bits between the selected sense amplifiers SA and the read/write circuit (not shown). Thus, the data read-out/data write-in are similar to those of the prior art semiconductor dynamic random access memory device.

In this instance, $2^m$ columns of dynamic random access memory cells form the memory cell array 31, and the memory cell array 31 has eight columns of memory cell blocks MC. Eight is the third power of two. As a result, $2^{m-3}$ columns of dynamic random access memory cells are incorporated in each memory cell block MC. $2^{m-3}$ columns of dynamic random access memory cells require columns of redundant dynamic random access memory cells, $2^{m-3}$ columns of dynamic random access memory cells and the columns of redundant random access memory cells form in combination each memory cell block MC. Thus, the redundant dynamic random access memory cells are evenly given to the memory cell blocks MC, and the $2^{m-3}$ columns of dynamic random access memory cells and the columns of redundant dynamic random access memory cells occupy a column of plate spaces indicated by arrow AR5.

When a dynamic random access memory cell is found to be defective through a diagnosis, related four columns of dynamic random access memory cells are replaced with four columns of redundant dynamic random access memory cells, and the redundant circuit steers an access from the defective column of dynamic random access memory cells to the column of redundant dynamic random access memory cells. The redundant circuit is well known to a person skilled in the art, and no further description is incorporated hereinbelow.

Figure 6:
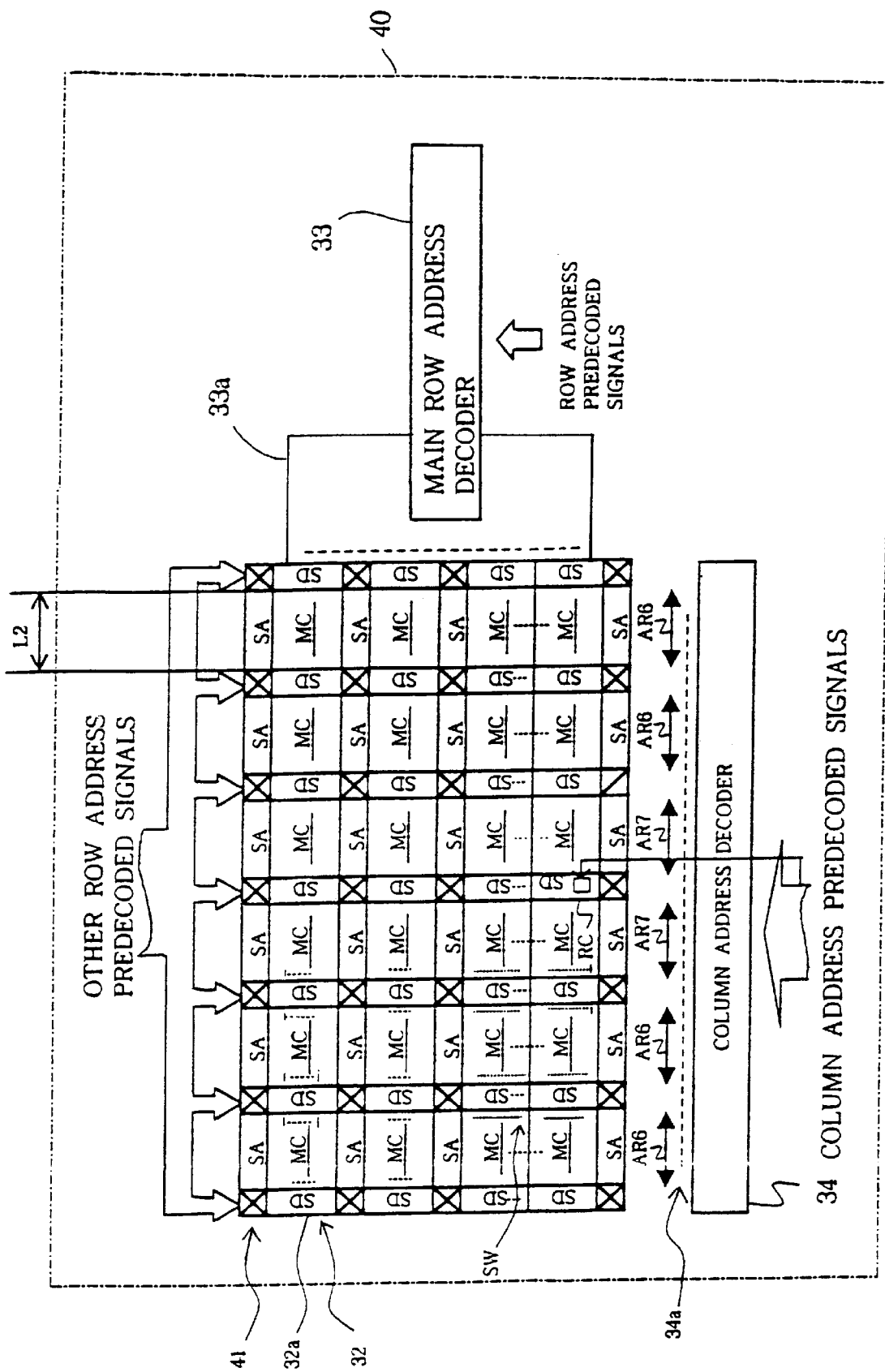
FIG. 6 is a schematic plane view showing the layout of memory cells incorporated in another semiconductor dynamic random access memory device redesigned on the basis of the semiconductor dynamic random access memory device shown in FIG. 5.

Assuming now that the manufacturer redesigns the semiconductor dynamic random access memory device shown in FIG. 5, a new semiconductor dynamic random access memory device is to have six columns of memory cell blocks MC as shown in FIG. 6. The semiconductor dynamic random access memory device shown in FIG. 6 is fabricated on a semiconductor chip 40, and is different in columns of memory cell blocks MC from the semiconductor dynamic random access memory device shown in FIG. 5. For this reason, components shown in FIG. 6 are labeled with references designating corresponding components shown in FIG. 5 without detailed description. In this instance, the redundant circuit is formed in a portion of a second sub-area or second sub-areas, and is labeled with "RC". When a regular dynamic random access memory cell or cells are found to be defective through a diagnosis, associated four columns of regular dynamic random access memory cells are replaced with four columns of redundant dynamic random access memory cells, and the column address assigned to the defective columns is stored in the redundant circuit RC. If the column address predecoded signals are indicative of the address assigned to the defective columns, the redundant circuit RC makes the decoder unit associated with the redundant columns active.

Two columns of row address sub-decoders SD are deleted from the memory cell array 41 of the semiconductor dynamic random access memory device shown in FIG. 6. The row address sub-decoder SD occupies the second sub-area, and the second sub-area has length L1. For this reason, the total area assigned to the row address sub-decoders SD is narrower than that assigned to the row address sub-decoders SD shown in FIG. 5 by 2×L1.

The sense amplifiers SA are associated with the bit line pairs BL, respectively, and the column address decoder 34 has plural decoder units 34b respectively connected to the control signal lines 34a. Each decoder unit 34b controls the transfer gates TG associated with four sense amplifiers SA through one of the control signal lines 34a as shown in FIG. 7.

If the memory cell array 41 have $2^m$ columns of dynamic random access memory cells without redundant dynamic random access memory cells, the manufacturer can not arrange $2^m$ columns of dynamic random access memory cells into six columns of memory cell blocks MC, because the decoder units 34b does not satisfy the following expression.

$$(4 \times N) \times 6 = 24 \times N \neq 2^m$$

where N is the number of decoder units 34a associated with each column of memory cell blocks MC. If the memory cell array 41 is simply divided into six columns of memory cell blocks MC, certain decoder units 34b drive control signal lines 34a connected to the transfer gates TG associated with the four sense amplifiers SA, and other decoder units 34b drive control signal lines 34a connected to the transfer gates TG not associated with the four sense amplifiers SA. This means that the load is different between the decoder units 34b.

In order to make the load of the decoder units 34b even, the memory cell array 41 is broken down into two kinds of memory cell blocks MC. The first kind of memory cell blocks MC contains the regular dynamic random access memory cells, only, and the columns of those memory cell blocks MC are indicated by arrows AR6. On the other hand, the second kind of memory cell blocks MC contains both of the regular dynamic random access memory cells and the redundant dynamic random access memory cells, and the columns of those memory cell blocks MC are indicated by arrows AR7. In this instance, four columns of memory cell blocks MC are categorized in the first kind, and two columns of memory cell blocks MC are categorized in the second kind. The decoder units 34b assigned to the two kinds of memory cell blocks MC satisfy the following expression.

$$(4 \times N) \times 4 + (4 \times M) \times 2 = 2^m$$

Thus, the concentration of the redundant dynamic random access memory cells on selected memory cell blocks MC equalizes the load of the decoder unit 34b.

Figure 8:
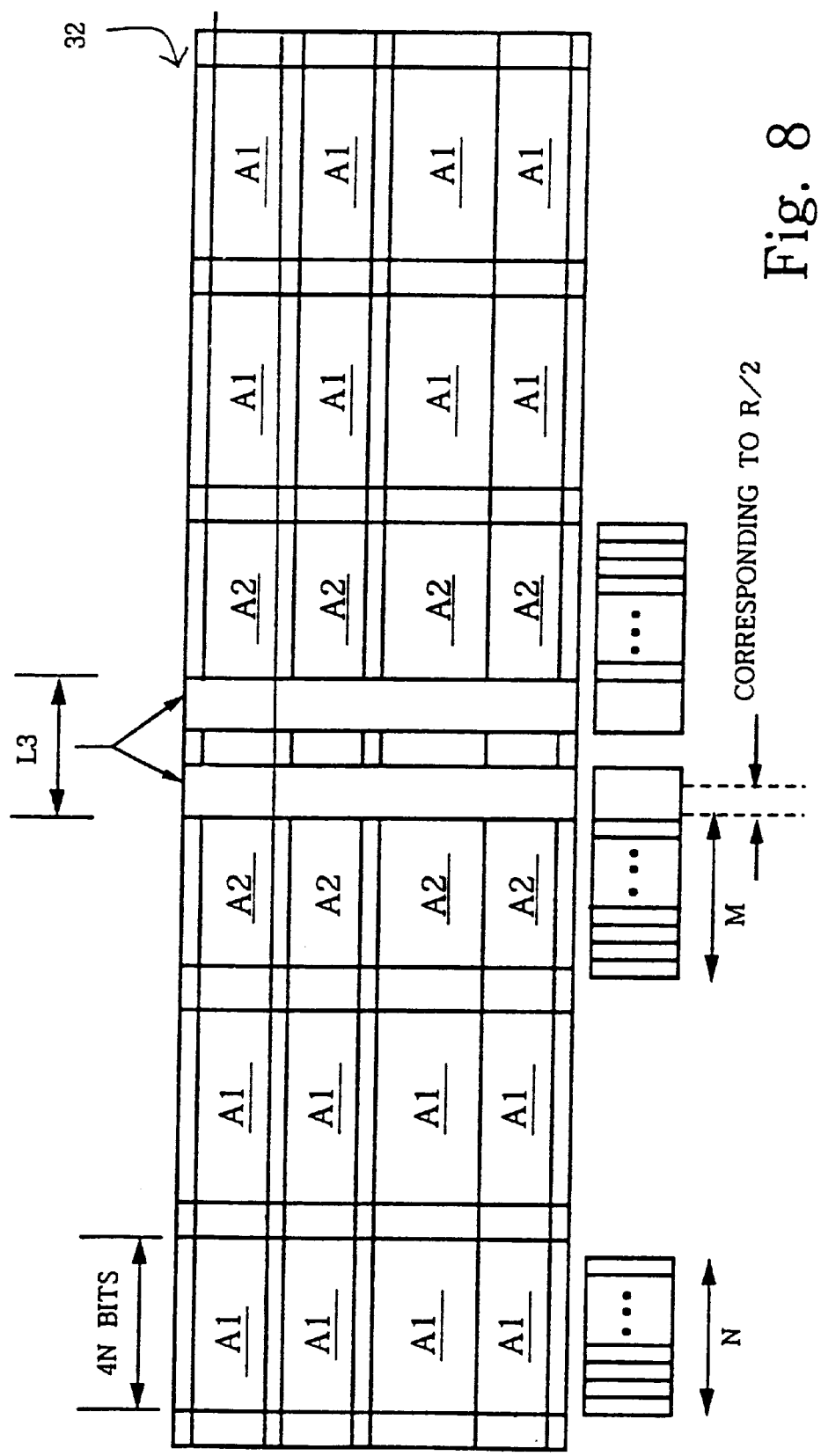
FIG. 8 is a schematic plane view showing the layout shown in FIG. 6 in detail.

It is further necessary to equalize the load between the row address sub-decoders SD. The load coupled to each row address sub-decoder SD is dependent on the length of sub-word lines SW and, accordingly, length L2 of the small rectangular sub-area. In order to equalize length L2 between the small rectangular sub-areas assigned to the first kind of memory cell blocks MC and the small rectangular sub-areas assigned to the second kind of memory cell blocks MC, the small rectangular sub-areas assigned to the second kind of memory cell blocks MC are prolonged by R/2 as follows.

$$4 \times N = 4 \times M + R/2$$

where R is the length L3 of an area assigned to all the columns of redundant dynamic random access memory cells (see FIG. 8) and N is greater than M. In FIG. 8, the small rectangular sub-area assigned to the first kind of memory cell block MC is labeled with A1, and the small rectangular sub-area assigned to the second kind of memory cell block MC is labeled with A2. Thus, the additional area corresponding to R/2 makes the small rectangular sub-area A1 equal in length to the small rectangular sub-area A2, and the row address sub-decoders SD respectively drive the loads equal to one another.

In this instance, the small rectangular sub-areas A1 are located on both sides of the small rectangular sub-areas A2, and, accordingly, the small rectangular sub-areas A2 occupy a central portion of the rectangular area 32. The small rectangular sub-areas A2 form two columns on both sides of the column of row address sub-decoders SD, and the manufacturer locates the columns of redundant dynamic random access memory cells closer to the row address sub-decoders SD than the columns of regular dynamic random access memory cells in each memory cell block MC. This feature is desirable, because the manufacturer can form the redundant circuit RC and signal lines between the redundant circuit RC and the decoder units 34b associated with the columns of redundant dynamic random access memory cells in the second sub-areas assigned to the row address sub-decoders SD. The redundant circuit RC close to the decoder units 34b makes the time to be required for the replacement between the defective columns and the redundant columns as short as possible. This results in an access time equalized between the regular dynamic random access memory cells and the redundant dynamic random access memory cells.

However, the manufacturer can locate the small rectangular areas A2 at any portion of the rectangular area 32 from the following viewpoints. The first viewpoint is the replacement between a defective column or columns and redundant column or columns. The second viewpoint is electric characteristics of the peripheral circuits, and the third viewpoint is the fabrication technologies. The small rectangular sub-areas A2 may be located at the closest portion to the main row address decoder 33 or at the farthest portion from the main row address decoder 33.

Although the memory cell array is redesigned from eight columns of memory cell blocks MC to six columns of memory cell blocks MC in the above-described embodiment, the manufacturer may redesign the memory cell array from eight columns of memory cell blocks MC to four columns of memory cell blocks MC. However, the redesign to six columns is desirable rather than the redesign to four columns, because the small rectangular sub-areas in the four columns are too wide to drive the sub-word lines at high speed. When the manufacturer redesigns the memory cell array from the eight columns to six columns, the sub-word lines SW becomes 4/3 times longer than that of the eight columns, and the resistance and the parasitic capacitance are increased 4/3 times. As a result, the time constant is increased 1.8 times. However, if the memory cell array is redesigned from eight columns to four columns, the time constant is increased four times. The redesign from the eight columns to the six columns results in deletion of two columns of row address sub-decoders SD, and the manufacturer shrinks the rectangular area 32 through the deletion. Thus, the redesign from the eight columns to the six columns is more appropriate than the redesign from the eight columns to the four columns.

If the manufacturer redesigns a memory cell array from sixteen columns to fourteen columns, twelve columns or ten columns, the twelve columns or the ten columns is more appropriate than the fourteen columns, because the fourteen columns does not achieve reduction of occupation area, sufficiently.

In the first embodiment, the row address sub-decoders SD, the transfer gates TG and the column address decoder 34 serve as a first peripheral circuit, a second peripheral circuit and a third peripheral circuit, respectively. The sub-word lines SW and the control signal lines 34a are corresponding to first selecting signal lines and second selecting signal lines, respectively.

As will be understood from the foregoing description, the manufacturer achieves the equalization of load to the decoder units 34b through the concentration of redundant dynamic random access memory cells and the equalization of load to the row address sub-decoders SD through the additional area. Thus, the manufacturer can unevenly divide the memory cell array into the columns of memory cell blocks without undesirable influences on the peripheral circuits.

Second Embodiment

Figure 9:
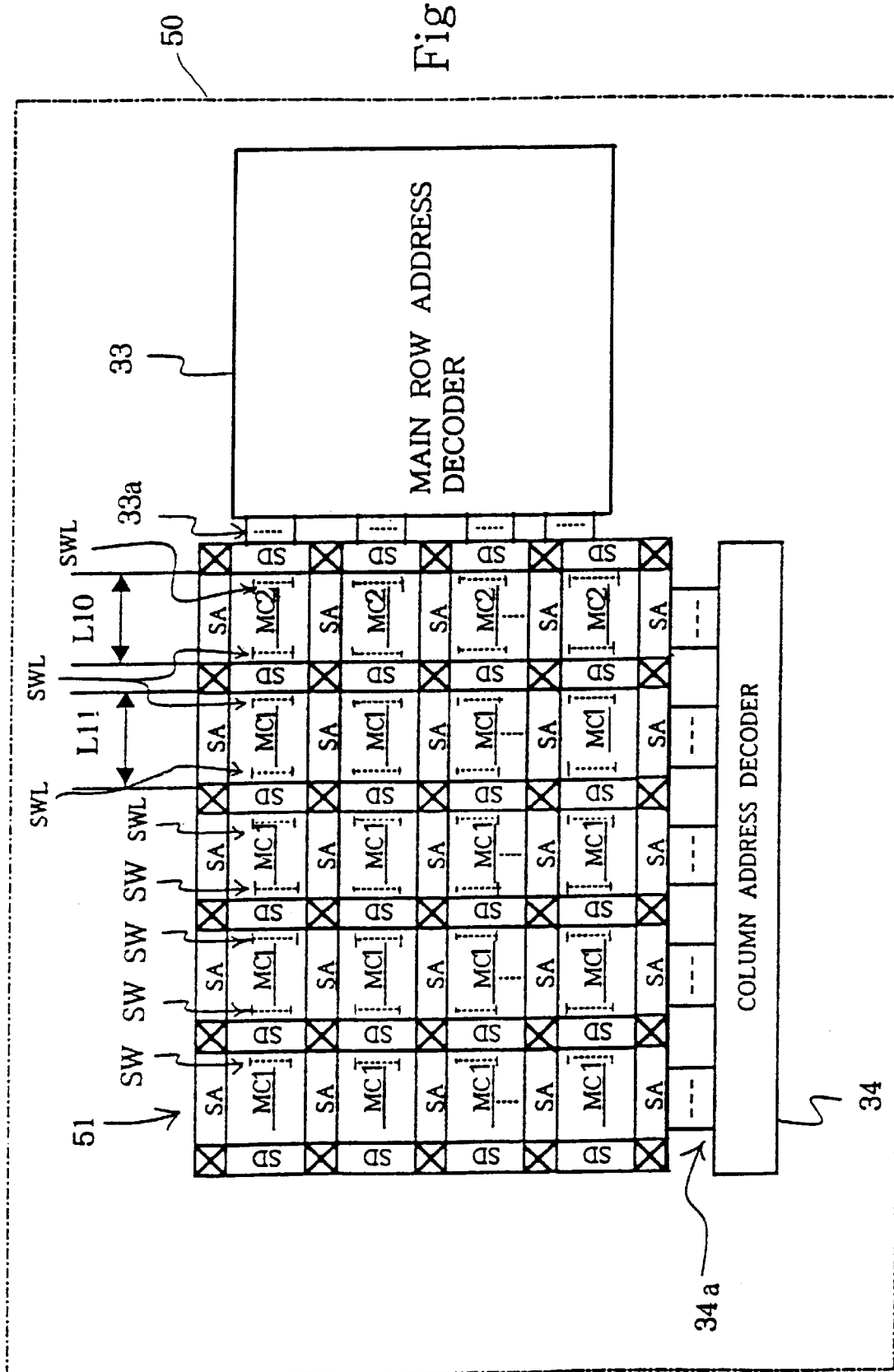
FIG. 9 is a schematic plane view showing the layout of memory cells incorporated in another semiconductor dynamic random access memory device according to the present invention.

Turning to FIG. 9 of the drawings, another semiconductor dynamic random access memory device embodying the present invention is fabricated on a semiconductor chip 50. The semiconductor dynamic random access memory device comprises a memory cell array 51 and peripheral circuits. The peripheral circuits such as a main row address decoder, row address sub-decoders, a column address decoder, sense amplifiers and drivers for the sense amplifiers are arranged in a similar manner to those of the first embodiment, and are labeled with references designating corresponding peripheral circuits of the first embodiment without detailed description. The column address decoder 34 includes plural decoder units, and each decoder unit controls transfer gates connected to four sense amplifiers SA as similar to the decoder units 34b.

The memory cell array 51 includes $2^m$ columns of dynamic random access memory cells, is divided into five columns of memory cell blocks MC1/MC2. The $2^m$ columns of dynamic random access memory cells partially serve as columns of regular dynamic random access memory cells and partially as columns of redundant dynamic random access memory cells. The regular dynamic random access memory cells form the four columns of memory cell blocks MC1, and the column of memory cell blocks MC2 contains both of columns of regular dynamic random access memory cells and columns of redundant dynamic random access memory cells. The memory cell array 51 satisfies the following expression.

$$(4 \times N) \times (D-1) + (4 \times M) \times 1 = 2^m$$

where N is the decoder units for the columns of regular dynamic random access memory cells, M is the decoder units for the columns of redundant dynamic random access memory cells and D is the columns of memory cell blocks MC1/MC2. Each of the decoder units controls the four transfer gates, and the load to be driven is equal between the decoder units.

Although the columns of dynamic random access memory cells in each memory cell block MC1 is less than the columns of dynamic random access memory cells in each memory cell block MC2, the area assigned to each memory cell block MC2 has length L10 equal to length L11 of the area assigned to each memory cell block MC1, because the area assigned to the memory cell block MC2 includes an additional area not assigned to any column of dynamic random access memory cells. The additional area is corresponding to an area occupied by the columns of redundant dynamic random access memory cells, and L10 and L11 are expressed as follows.

$$L11=4\times N$$

$$L11=4\times M+R$$

$$4\times N=4\times M+R$$

where R is the length of the additional area in the direction of row. The equalization between L10 and L11 makes the sub-word lines SWL equal in length, and the row address sub-decoders SD exhibit well-regulated performances.

Thus, the second embodiment achieves all the advantages of the first embodiment.

Although particular embodiments of the present invention have been shown and described, it will be apparent to those skilled in the art that various changes and modifications may be made without departing from the spirit and scope of the present invention.

For example, if each decoder unit 34b controls the transfer gates connected to two sense amplifiers SA, the small rectangular sub-area A1 has length L2 corresponding to (2×N) bits.

Another kind of memory cells such as read-only memory cells or electrically erasable and programmable read only memory cells may form the memory cell arrays 31/41/51.

What is claimed is:

1. A semiconductor memory device fabricated on a semiconductor substrate, comprising:
    a memory cell array including plural memory cell blocks equal to a multiple of a natural number except powers of two, formed on first areas arranged in a first direction at intervals and a second direction perpendicular to said first direction at intervals and selectively categorized in a first kind of memory cell block having directly addressable regular memory cells and a second kind of memory cell block having other regular memory cells and redundant memory cells,
    a part of said directly addressable memory cells and a part of said other directly addressable memory cells being replaceable with said redundant memory cells,
    said first areas having respective first lengths measured in said first direction and approximately equal to one another;
    plural groups of first selecting signal lines associated with said plural memory cell blocks, respectively, and respectively extending over said first areas assigned to the associated memory cell blocks in said first direction,
    the first selecting lines of said plural groups being selectively connected to said directly addressable memory cells, said other directly addressable memory cells and said redundant memory cells incorporated in the associated memory cell blocks;
    a first peripheral circuit formed in second areas between said first areas spaced in said first direction, connected to said plural groups of first selecting signal lines, and responsive to first address signals so as to selectively drive said first selecting signal lines, thereby making said directly addressable memory cells, said other directly addressable memory cells or said redundant memory cells selectively accessible;
    second selecting signal lines respectively coupled to loads approximately equal to one another;
    a second peripheral circuit connected to said second selecting signal lines for selectively connecting the directly addressable memory cells, the other directly addressable memory cells or the redundant memory cells selected by said first peripheral circuit to a signal line; and
    a third peripheral circuit including plural sub-circuits respectively connected to said second selecting signal lines and responsive to second address signals for selectively driving said second selecting signal lines.

2. The semiconductor memory device as set forth in claim 1, further comprising a redundant circuit responsive to said second address signals so as to selectively replace said directly addressable memory cells and said other directly addressable memory cells with said redundant memory cells.

3. The semiconductor memory device as set forth in claim 2, in which said directly addressable memory cells, said other directly addressable memory cells and said redundant memory cells are a kind of dynamic random access memory cell.

4. The semiconductor memory device as set forth in claim 2, further comprising a fourth peripheral circuit responsive to third address signals so as to selectively driving third selecting signal lines connected between said fourth peripheral circuit and sub-circuits of said first peripheral circuits, thereby selectively making said sub-circuits of said first peripheral circuit responsive to said first address signals.

5. The semiconductor memory device as set forth in claim 4, in which said sub-circuits of said first peripheral circuit, said second peripheral circuit, said sub-circuits of said third peripheral circuit and said fourth peripheral circuit are row address sub-decoders, transfer gates, decoder units of a column address decoder and a main row address decoder, respectively.

6. The semiconductor memory device as set forth in claim 5, further comprising sense amplifiers formed in third areas between said first areas spaced in said second direction and selectively connected between said transfer gates and said directly addressable memory cells, said other directly addressable memory cells and said redundant memory cells.

7. The semiconductor memory device as set forth in claim 6, in which said natural number is an even number.

8. The semiconductor memory device as set forth in claim 6, in which said even number is six, and four of said plural memory cell blocks and the remaining memory cell blocks are categorized in said first kind of memory cell block and said second kind of memory cell block, respectively.

9. The semiconductor memory device as set forth in claim 8, in which said directly addressable memory cells of each of the four memory cell blocks are formed in a first number of columns respectively connected to the sense amplifiers associated with said each of four memory cell blocks, said other directly addressable memory cells and said redundant memory cells are formed in a second number of columns and a third number of columns, and said first number is greater than the sum of said second number and said third number.

10. The semiconductor memory device as set forth in claim 9, in which said two memory cell blocks are located on both sides of a column of said row-address sub-decoders, and said redundant circuit is formed in at least one of said second areas.

11. The semiconductor memory device as set forth in claim 9, in which the first area assigned to each of said remaining memory cell blocks has a vacant portion having a second length measured in said first direction and equal to a third length of a half of an area occupied by said third number of columns.

12. The semiconductor memory device as set forth in claim 6, in which said natural number is an odd number.

13. The semiconductor memory device as set forth in claim 12, in which one of said plural memory cell blocks is categorized in said second kind of memory cell block and the remaining memory cell blocks are categorized in said first kind of memory cell block, respectively.

14. The semiconductor memory device as set forth in claim 13, in which said directly addressable memory cells of each of the remaining memory cell blocks are formed in a first number of columns respectively connected to the sense amplifiers associated with said each of four memory cell blocks, said other directly addressable memory cells and said redundant memory cells in said one of said plural memory cell block are formed in a second number of columns and a third number of columns, and said first number is greater than the sum of said second number and said third number.

15. The semiconductor memory device as set forth in claim 14, in which the first area assigned to said one of said plural memory cell blocks has a vacant area having a second length measured in said first direction and equal to a length of an area occupied by said third number of columns.

* * * * *